(12) United States Patent
Liu et al.

(10) Patent No.: US 12,373,393 B2
(45) Date of Patent: Jul. 29, 2025

(54) DATA COMPRESSION METHOD AND APPARATUS

(71) Applicant: Huawei Technologies Co., Ltd., Shenzhen (CN)

(72) Inventors: Bang Liu, Saint Petersburg (RU); Kai Zhu, Chengdu (CN); Ke Li, Chengdu (CN); Wen Yang, Chengdu (CN); Jianqiang Shen, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 106 days.

(21) Appl. No.: 18/475,849

(22) Filed: Sep. 27, 2023

(65) Prior Publication Data

US 2024/0020005 A1    Jan. 18, 2024

Related U.S. Application Data

(63) Continuation of application No. PCT/CN2022/080171, filed on Mar. 10, 2022.

(30) Foreign Application Priority Data

Mar. 30, 2021  (CN) .......................... 202110343632.8

(51) Int. Cl.
*G06F 3/06* (2006.01)
*G06F 16/174* (2019.01)

(52) U.S. Cl.
CPC ........ *G06F 16/1744* (2019.01); *G06F 3/0608* (2013.01); *G06F 3/0641* (2013.01); *G06F 3/0673* (2013.01)

(58) Field of Classification Search
CPC .... G06F 3/0608; G06F 3/0641; G06F 3/0673; G06F 3/064; G06F 3/0661; G06F 3/067; G06F 3/0689; G06F 16/1744; G06F 16/215; H03M 7/3077; H03M 7/3091
See application file for complete search history.

(56) References Cited

U.S. PATENT DOCUMENTS

| 9,678,977 B1 * | 6/2017 | Aronovich | ............ G06F 3/0689 |
| 10,572,153 B2 * | 2/2020 | Singhai | ................. G06F 3/0673 |
| 11,797,204 B2 * | 10/2023 | Luo | .......................... H03M 7/30 |
| 2010/0125553 A1 * | 5/2010 | Huang | ................. G06F 11/1453 707/661 |

(Continued)

FOREIGN PATENT DOCUMENTS

| EP | 2571171 A2 | 3/2013 |
| WO | 2018111133 A1 | 6/2018 |

(Continued)

*Primary Examiner* — Jorge A Casanova
(74) *Attorney, Agent, or Firm* — Conley Rose, P.C.

(57) ABSTRACT

A data compression method includes providing one or more data block sets, where each data block set includes a plurality of data blocks with a same fingerprint; providing one or more compression groups based on a similarity degree between a plurality of data blocks included in each data block set, where one compression group includes a plurality of similar data blocks, the plurality of similar data blocks are a subset of data blocks included in the one or more data block sets, and a similarity degree between the plurality of similar data blocks meets a specific similarity condition; and compressing the plurality of similar data blocks included in the compression group.

12 Claims, 8 Drawing Sheets

(56) References Cited

U.S. PATENT DOCUMENTS

| | | | | |
|---|---|---|---|---|
| 2017/0123676 A1* | 5/2017 | Singhai | ................ | G06F 3/0608 |
| 2019/0294589 A1* | 9/2019 | Moiseev | ............... | G06F 3/0608 |
| 2020/0387479 A1* | 12/2020 | Karr | ...................... | G06F 16/125 |
| 2021/0397350 A1 | 12/2021 | Luo et al. | | |
| 2022/0147255 A1 | 5/2022 | Guan et al. | | |
| 2022/0236870 A1* | 7/2022 | Shabi | ................... | G06F 3/0673 |
| 2022/0365875 A1* | 11/2022 | Mao | ...................... | G06F 3/0679 |
| 2023/0019207 A1* | 1/2023 | Natanzon | .............. | G06F 3/0641 |

FOREIGN PATENT DOCUMENTS

| | | | |
|---|---|---|---|
| WO | 2020253406 A1 | 12/2020 | |
| WO | 2021012162 A1 | 1/2021 | |

\* cited by examiner

DATA COMPRESSION METHOD AND APPARATUS

CROSS-REFERENCE TO RELATED APPLICATIONS

This is a continuation of International Patent Application No. PCT/CN2022/080171 filed on Mar. 10, 2022, which claims priority to Chinese Patent Application No. 202110343632.8 filed on Mar. 30, 2021. The disclosures of the aforementioned applications are hereby incorporated by reference in their entireties.

TECHNICAL FIELD

This application relates to the storage field, and specifically, to a data compression method and an apparatus.

BACKGROUND

With the rapid development of big data, cloud computing, and artificial intelligence technologies, demand for data is increasing. Accordingly, a data reduction technology becomes a key technology for a storage system. Currently, a similar data deletion technology for data reduction mainly includes the following processes: extracting a similar fingerprint (Sfp) of a to-be-compressed data block; determining, based on the similar fingerprint, a reference data block similar to the to-be-compressed data block; and performing similar data deletion (delta compression) on the to-be-compressed data block based on the reference data block. A similar fingerprint of a data block is a data feature extracted from the data block by using, for example, a rabin hash algorithm. If similar fingerprints of two data blocks are the same, it indicates that the two data blocks are similar data blocks. Although the reference data block similar to the to-be-compressed data block can be found based on the similar fingerprint, a similarity degree between the to-be-compressed data block and the reference data block cannot be distinguished based on the similar fingerprint, and consequently compression efficiency is low.

SUMMARY

Embodiments of this application are intended to provide a more effective data compression and decompression solution. A plurality of data blocks with a high similarity degree are determined from a plurality of data blocks with a same similar fingerprint feature for combined compression. Therefore, a data reduction ratio of data compression is improved and data storage space is saved.

To achieve the foregoing objectives, a first aspect of this application provides a data compression method including providing one or more data block sets, where each data block set includes a plurality of data blocks with a same similar fingerprint; generating one or more compression groups based on a similarity degree between a plurality of data blocks included in each data block set, where one compression group includes a plurality of similar data blocks, the plurality of similar data blocks are a subset of data blocks included in the one or more data block sets, and a similarity degree between the plurality of similar data blocks meets a specific similarity condition; and compressing the plurality of similar data blocks included in the compression group.

The one or more compression groups are generated based on a similarity degree between the plurality of data blocks with the same similar fingerprint, and a data block in the compression group meets the specific similarity condition. Therefore, high data compression efficiency can be provided when data blocks in the compression group are compressed.

In a possible implementation of the first aspect of this application, each similar data block has N data features, and the N data features describe a data block from N dimensions; and the similarity condition includes that at least two similar data blocks share M data features of the N data features, M is less than or equal to N, and there is an association relationship between the plurality of similar data blocks in the compression group.

When the similarity condition is that the at least two similar data blocks in the compression group share the M data features of the N data features, a similarity degree between the at least two similar data blocks in the compression group is greater than or equal to a similarity degree determined based on a minimum value of M. Therefore, the high data compression efficiency can be provided when the data blocks in the compression group are compressed.

In a possible implementation of the first aspect of this application, the similarity condition further includes: M is greater than a specific threshold.

That M is greater than the specific threshold is included in the similarity condition, so that the similarity degree between the at least two similar data blocks in the compression group is greater than or equal to a similarity degree determined based on the threshold. Therefore, the high data compression efficiency can be provided when the data blocks in the compression group are compressed.

In a possible implementation of the first aspect of this application, the plurality of similar data blocks in the compression group form a logic chain, the association relationship is that two adjacent similar data blocks on the logic chain share P data features, and P is greater than or equal to M and less than or equal to N.

The compression group includes the plurality of data blocks forming the logical chain. Because a similarity degree between every two adjacent data blocks on the logical chain is greater than or equal to a specific degree (which is a similarity degree determined based on a minimum value of P), the high data compression efficiency is provided when the data blocks in the compression group are compressed.

In a possible implementation of the first aspect of this application, a quantity of the plurality of similar data blocks is X, each similar data block has N data features, and the N data features describe a data block from N dimensions; and the similarity condition is that X data blocks with a highest similarity degree are selected from the one or more data block sets based on the N data features, and X is an integer greater than or equal to 2.

In a case in which a quantity of data blocks included in the compression group is a predetermined quantity, the similarity condition is that X data blocks with the highest similarity degree are selected from the one or more data block sets such that the compression group includes X data blocks with a similarity degree as high as possible. Therefore, the high data compression efficiency can be provided when the data blocks in the compression group are compressed.

In a possible implementation of the first aspect of this application, the method further includes calculating a similar fingerprint of a to-be-compressed data block; recording the to-be-compressed data block into a first data block set corresponding to a data block with the same similar fingerprint as the to-be-compressed data block, where the first data block set is one of the one or more data block sets;

determining, from the first data block set, a target data block that shares most data features with the to-be-compressed data block; and determining a first compression group including the target data block, and adding the to-be-compressed data block to the first compression group.

In a case that the to-be-compressed data block has a plurality of similar fingerprints, the to-be-compressed data block is recorded in a plurality of first data block sets, and a target data block that shares most data features with the to-be-compressed data block is determined from the plurality of first data block sets, to group the to-be-compressed data block.

In a possible implementation of the first aspect of this application, compressing the plurality of similar data blocks included in the compression group includes combining the plurality of similar data blocks into a combined data block; and compressing the combined data block to obtain compressed data.

In a possible implementation of the first aspect of this application, the method further includes generating metadata of the compressed data, where the metadata includes location information of the plurality of similar data blocks in the combined data block, and the metadata is for decompressing the compressed data.

In a possible implementation of the first aspect of this application, compressing the plurality of similar data blocks included in the compression group includes selecting a reference data block from the plurality of similar data blocks; and performing delta compression on another similar data block in the plurality of similar data blocks based on the reference data block to obtain compressed data.

In a possible implementation of the first aspect of this application, the method further includes generating metadata of the compressed data, where the metadata includes information about a reference data block during the delta compression and location information, in the compressed data, of data obtained by performing delta compression on each similar data block, and the metadata is for decompressing the compressed data.

A second aspect of this application provides a data compression apparatus, including a providing unit configured to provide one or more data block sets, where each data block set includes a plurality of data blocks with a same similar fingerprint; a generation unit configured to generate one or more compression groups based on a similarity degree between a plurality of data blocks included in each data block set, where one compression group includes a plurality of similar data blocks, the plurality of similar data blocks are a subset of data blocks included in the one or more data block sets, and a similarity degree between the plurality of similar data blocks meets a specific similarity condition; and a compression unit, configured to compress the plurality of similar data blocks included in the compression group.

In a possible implementation of the second aspect of this application, each similar data block has N data features, and the N data features describe a data block from N dimensions; and the similarity condition includes that at least two similar data blocks share M data features of the N data features, M is less than or equal to N, and there is an association relationship between the plurality of similar data blocks in the compression group.

In a possible implementation of the second aspect of this application, the similarity condition further includes that M is greater than a specific threshold.

In a possible implementation of the second aspect of this application, the plurality of similar data blocks in the compression group form a logic chain, the association relationship is that two adjacent similar data blocks on the logic chain share P data features, and P is greater than or equal to M and less than or equal to N.

In a possible implementation of the second aspect of this application, a quantity of the plurality of similar data blocks is X, each similar data block has N data features, and the N data features describe a data block from N dimensions; and the similarity condition is that X data blocks with a highest similarity degree are selected from the one or more data block sets based on the N data features, and X is an integer greater than or equal to 2.

In a possible implementation of the second aspect of this application, the apparatus further includes a calculating unit configured to calculate a similar fingerprint of a to-be-compressed data block; a recording unit configured to record the to-be-compressed data block into a first data block set corresponding to a data block that has the same similar fingerprint as the to-be-compressed data block, where the first data block set is one of the one or more data block sets; a determining unit configured to determine, from the first data block set, a target data block that shares most data features with the to-be-compressed data block, and determine a first compression group including the target data block; and an adding unit configured to add the to-be-compressed data block to the first compression group.

In a possible implementation of the second aspect of this application, the compression unit is further configured to combine the plurality of similar data blocks into a combined data block; and compress the combined data block to obtain compressed data.

In a possible implementation of the second aspect of this application, the compression unit is further configured to generate metadata of the compressed data, the metadata includes location information of the plurality of similar data blocks in the combined data block, and the metadata is for decompressing the compressed data.

In a possible implementation of the second aspect of this application, the compression unit is further configured to select a reference data block from the plurality of similar data blocks; and perform delta compression on another similar data block in the plurality of similar data blocks based on the reference data block to obtain compressed data.

In a possible implementation of the second aspect of this application, the compression unit is further configured to generate metadata of the compressed data, the metadata includes information about a reference data block during delta compression and location information, in the compressed data, of data obtained by performing delta compression on each similar data block, and the metadata is for decompressing the compressed data.

A third aspect of this application provides a data decompression method including obtaining compressed data and metadata of the compressed data, where original data corresponding to the compressed data is obtained by combining a plurality of data blocks, a similarity degree between the plurality of data blocks meets a specific similarity condition, and the metadata includes location information of each data block in the original data; and decompressing the compressed data based on the metadata.

A fourth aspect of this application provides a data decompression method including obtaining compressed data and metadata of the compressed data, where original data corresponding to the compressed data includes a plurality of data blocks, a similarity degree between the plurality of data blocks meets a specific similarity condition, the metadata includes information about a reference data block of each data block during delta compression and location information, in the compressed data, of data obtained by performing delta compression on each data block, and the reference data block is one of the plurality of data blocks; and decompressing the compressed data based on the metadata.

A fifth aspect of this application provides a storage device, including a processing unit and a storage unit. The storage unit stores executable code, and the processing unit executes the executable code to implement the method according to at least one of the first aspect, the third aspect, and the fourth aspect of this application.

A sixth aspect of this application provides a computer-readable storage medium, storing a computer program, where when the computer program is executed in a computer or a processor, the computer or the processor is enabled to perform the method according to at least one of the first aspect, the third aspect, and the fourth aspect of this application.

A seventh aspect of this application provides a computer program product, where when the computer program product runs in a computer or a processor, the computer or the processor is enabled to perform the method according to at least one of the first aspect, the third aspect, and the fourth aspect of this application.

BRIEF DESCRIPTIONS OF DRAWINGS

Embodiments of this application are more clear described with reference to accompanying drawings.

DESCRIPTION OF EMBODIMENTS

The following describes the technical solutions in embodiments of this application with reference to the accompanying drawings.

Storage systems are classified into a centralized storage system and a distributed storage system. The centralized storage system is a system in which data is centrally stored on a central node including one or more master devices, and all data processing services of the entire system are centrally deployed on the central node. The distributed storage system is a system in which data is distributed and stored on a plurality of independent storage nodes. A user may store/retrieve data in/from a storage node via an application. A computer that runs these applications are referred to as an "application server." The application server may be a physical machine or a virtual machine. A physical application server includes but is not limited to a desktop computer, a server, a notebook computer, and a mobile device. The application server may access the storage node for data storage and retrieval via a fibre channel switch. However, the switch is an optional device, and the application server may communicate with the storage node directly over a network.

Figure 1A:
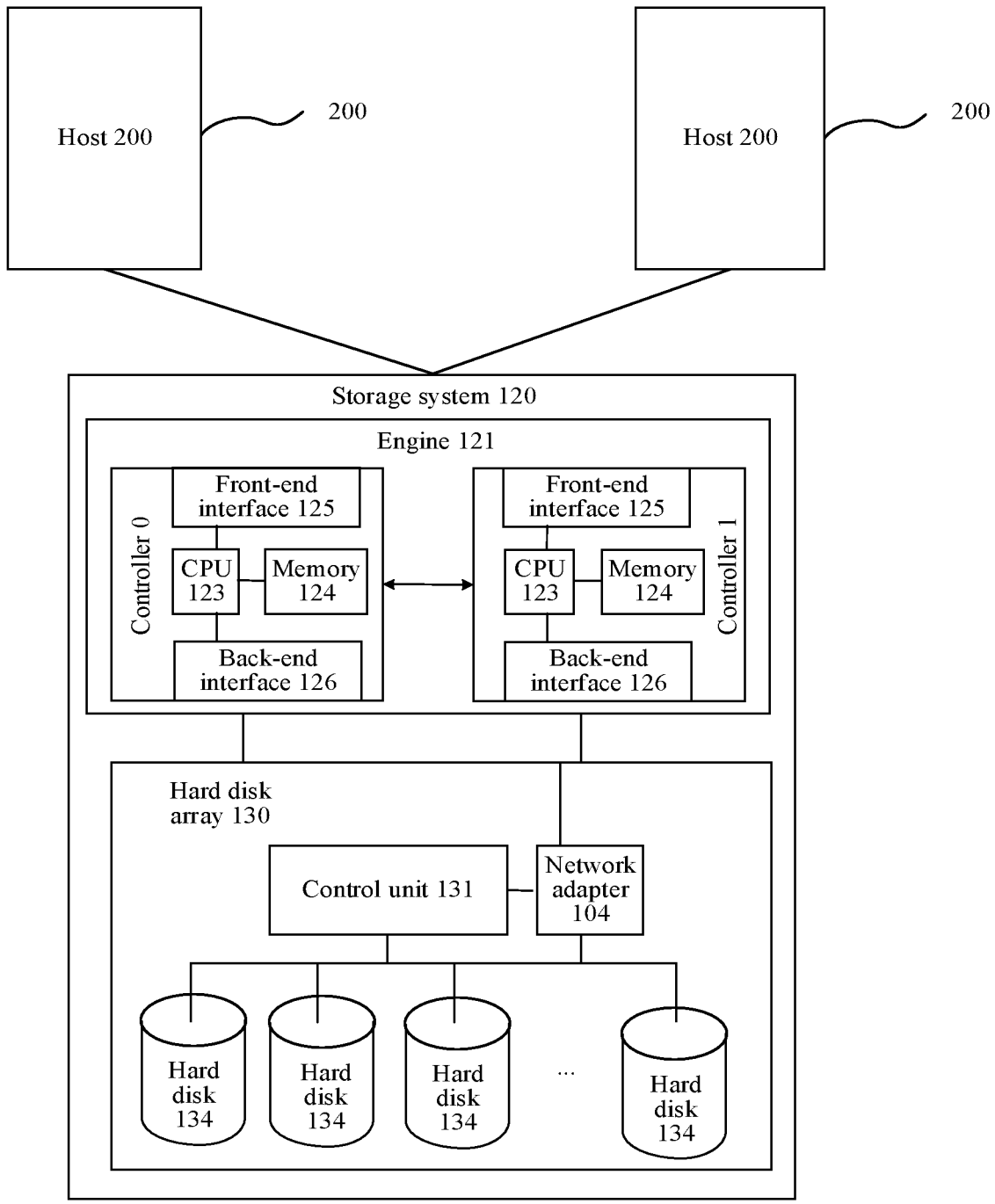
FIG. 1A is an architectural diagram of a centralized storage system with a disk-controller separation structure applied in an embodiment of this application.

FIG. 1A is an architectural diagram of a centralized storage system 120 with a disk-controller separation structure applied in an embodiment of this application. The storage system 120 is connected to a plurality of hosts 200. For example, the plurality of hosts 200 are application servers, and all the hosts are connected to the storage system 120 to store/retrieve data in/from the storage system 120. The centralized storage system shown in FIG. 1A has a unified entry, and all data from the host 200 needs to pass through the entry. The entry is, for example, an engine 121 in the storage system 120.

As shown in FIG. 1A, there are one or more controllers in the engine 121. In FIG. 1A, an example in which the engine includes two controllers is used for description. There is a mirror channel between a controller 0 and a controller 1. After the controller 0 writes a piece of data into a memory 124 of the controller 0, the controller 0 may send a copy of the data to the controller 1 through the mirror channel, and the controller 1 stores the copy in a local memory 124 of the controller 1. Therefore, the controller 0 and the controller 1 back up each other. When the controller 0 is faulty, the controller 1 may take over services of the controller 0. When the controller 1 is faulty, the controller 0 may take over services of the controller 1. Therefore, a case that the entire storage system 120 is unavailable due to a hardware fault is avoided. When four controllers are deployed in the engine 121, there is a mirror channel between any two controllers. Therefore, the any two controllers back up each other.

The engine 121 further includes a front-end interface 125 and a back-end interface 126. The front-end interface 125 is configured to communicate with the application server to provide a storage service for the application server. The back-end interface 126 is configured to communicate with a hard disk 134 to expand a capacity of the storage system. Via the back-end interface 126, the engine 121 may be connected to more hard disks 134, to form a quite large storage resource pool.

In terms of hardware, as shown in FIG. 1A, the controller 0 includes at least a processor 123 and a memory 124. The processor 123 is a central processing unit (CPU) configured to process a data access request from outside the storage system (a server or another storage system), and is also configured to process a request generated inside the storage system. For example, when receiving, via a front-end interface, a data writing request sent by a server, the processor 123 temporarily stores data in the data writing request in the memory 124. When a total amount of data in the memory 124 reaches a specific threshold, the processor 123 sends, via the back-end interface 126, the data stored in the memory 124 to the hard disk 134 for persistent storage.

The memory 124 is an internal memory that directly exchanges data with the processor 123. The memory 124 can read and write data with a high speed at any time, and is used as a temporary data storage for an operating system or another running program. There are two types of memories 124. For example, the memory may be a random-access memory (RAM) or a read-only memory (ROM). For example, the random-access memory is a—RAM (DRAM) or a storage class memory (SCM). The DRAM is a semiconductor memory. Like most RAMs, the DRAM is a volatile memory device. The SCM uses a composite storage technology that combines features of a conventional storage apparatus and a memory. The storage class memory is faster in speed of reading and writing than a hard disk, but the storage class memory is slower than the DRAM in a computing speed and cheaper than the DRAM in costs. However, the DRAM and the SCM are merely examples in embodiments, and the memory may further include another random-access memory, for example, a static RAM (SRAM). The read-only memory may be, for example, a programmable ROM (PROM) and an erasable PROM (EPROM). In addition, the memory 124 may alternatively be a dual in-line memory module or a dual in-line memory module (DIMM), that is, a module including a DRAM, or may be a solid-state drive (SSD). In an actual application, a plurality of memories 124 and different types of memories 124 may be configured in the controller 0. A quantity of memories 124 and a type of the memory 124 are not limited in embodiments. In addition, the memory 124 may be configured to have a power protection function. The power protection function means that when a system is powered off and then powered on again, data stored in the memory 124 is not lost. A memory with the power protection function is referred to as a nonvolatile memory.

The memory 124 stores a software program, and the processor 123 may manage the hard disk by running the software program in the memory 124. For example, the hard disk is abstracted into a storage resource pool and then divided into LUNs for the server. The LUN herein is actually the hard disk on the server. Certainly, some centralized storage systems are also file servers and can provide shared file services for the server.

A hardware component and a software structure of the controller 1 (and another controller not shown in FIG. 1A) are similar to those of the controller 0, and details are not described herein again.

In the storage system in which a disk and a controller are separated shown in FIG. 1A, the engine 121 may not have a hard disk slot, the hard disk 134 needs to be placed in a hard disk array 130, and the back-end interface 126 communicates with the hard disk array 130. The back-end interface 126 exists in the engine 121 in a form of an adapter card. One engine 121 may simultaneously use two or more back-end interfaces 126 to connect to a plurality of hard disk arrays. Alternatively, the adapter card may be integrated on a main board. In this case, the adapter card may communicate with the processor 123 via a Peripheral Component Interconnect Express (PCIE) bus.

It should be noted that only one engine 121 is shown in FIG. 1A. However, in an actual application, the storage system may include two or more engines 121, and redundancy or load balancing is performed among the plurality of engines 121.

The hard disk array 130 includes a control unit 131 and several hard disks 134. The control unit 131 may have various forms. In one case, the hard disk array 130 belongs to a smart disk enclosure. As shown in FIG. 1A, the control unit 131 includes a CPU and a memory. The CPU is configured to perform operations such as address translation and data reading and writing. The memory is configured to temporarily store data to be written to the hard disk 134, or read, from the hard disk 134, data to be sent to the controller. In another case, the control unit 131 is a programmable electronic component, for example, a data processing unit (DPU). The DPU has versatility and programmability of the CPU, but is more specialized, and can operate efficiently on a network packet, a storage request, or an analysis request. The DPU is distinguished from the CPU based on a high degree of parallelism (a large quantity of requests to be processed). Optionally, the DPU herein may alternatively be replaced with a graphics processing unit (GPU), an embedded neural-network processing unit (NPU), or another processing chip. Generally, there may be one or more control units 131, or there may be two or more control units 131. When the hard disk array 130 includes at least two control units 131, there is a homing relationship between the hard disk 134 and the control unit 131, and each control unit can access only a hard disk that belongs to the control unit. Therefore, this usually involves forwarding a data reading/writing request between the control units 131, resulting in a long path for data access. In addition, if storage space is insufficient, when a new hard disk 134 is added to the hard disk array 130, the homing relationship between the hard disk 134 and the control unit 131 needs to be re-bound. An operation is complex, resulting in poor scalability of the storage space. Therefore, in another implementation, a function of the control unit 131 may be offloaded to a network adapter 104. In other words, in this implementation, the hard disk array 130 does not have the control unit 131 inside, but the network adapter 104 completes data reading/writing, address conversion, and another computing function. In this case, the network adapter 104 is an intelligent network adapter. It may include a CPU and a memory. The CPU is configured to perform operations such as address translation and data reading and writing. The memory is configured to temporarily store data to be written to the hard disk 134, or read, from the hard disk 134, data to be sent to the controller. In another case, the network adapter may be a programmable electronic component, for example, a DPU. The DPU has versatility and programmability of the CPU, but is more specialized, and can operate efficiently on a network packet, a storage request, or an analysis request. The DPU is distinguished from the CPU based on a high degree of parallelism (a large quantity of requests to be processed). Optionally, the DPU herein may alternatively be replaced with a GPU, an embedded NPU, or another processing chip. There is no homing relationship between the network adapter 104 and the hard disk 134 in the hard disk array 130, and the network adapter 104 may access any hard disk 134 in the hard disk array 130. Therefore, it is convenient to expand the hard disk when the storage space is insufficient.

Depending on a type of a communication protocol between the engine 121 and the hard disk array 130, the hard disk array 130 may be a serial attached small computer system interface, (SCSI) (SAS) hard disk array, or may be an NVMe hard disk array, or another type of hard disk array. The SAS disk array complies with a SAS 3.0 protocol. Each enclosure supports 25 SAS disks. The engine 121 is connected to the hard disk array 130 via an onboard SAS interface or a SAS interface module. The Nonvolatile Memory Express (NVMe) hard disk array is more like a complete computer system. An NVMe hard disk is inserted into the NVMe hard disk array. Then, the NVMe hard disk array is connected to the engine 121 via a remote direct memory access (RDMA) port.

It may be understood that although FIG. 1A shows the centralized storage system with the disk-controller separation structure, an application scope of embodiments of this application is not limited. For example, embodiments of this application are further applicable to a centralized storage system with an integrated disk-controller structure shown in FIG. 1B. In the centralized storage system with the integrated disk-controller structure, a difference from the disk-controller separation structure is that the engine 121 has a hard disk slot, the hard disk 134 may be directly deployed in the engine 121, and the back-end interface 126 is an optional configuration. When storage space of the system is insufficient, more hard disks or hard disk arrays may be connected via the back-end interface 126.

Figure 1B:
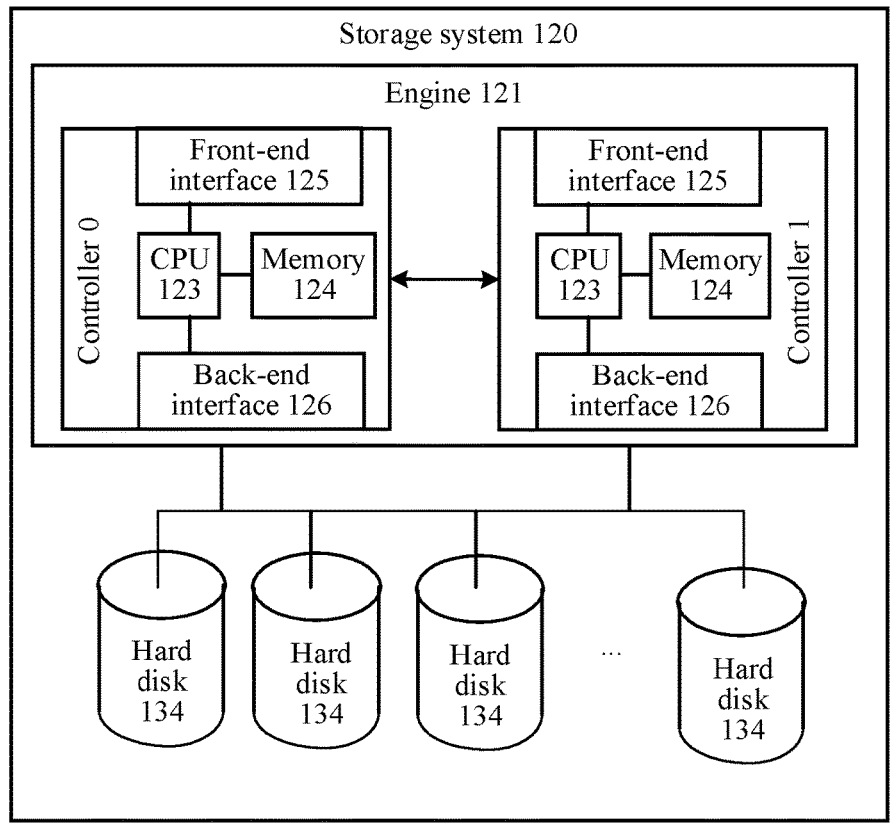
FIG. 1B is an architectural diagram of a centralized storage system with an integrated disk-controller structure applied in an embodiment of this application.
Figure 1C:
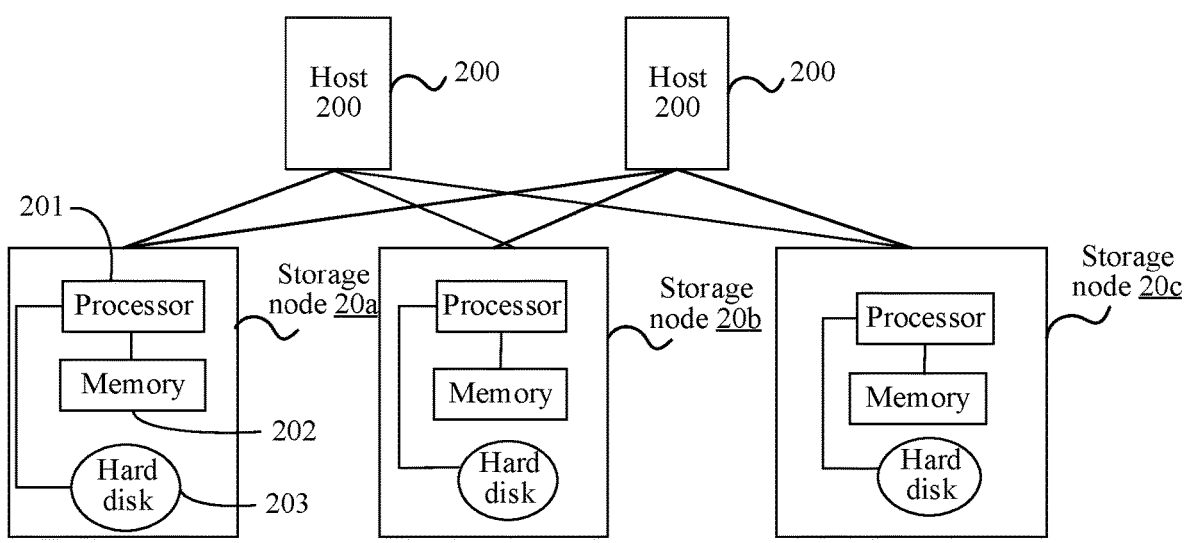
FIG. 1C is an architectural diagram of a distributed storage system applied in an embodiment of this application.

Embodiments of this application are further applicable to a distributed storage system shown in FIG. 1C. The distributed storage system includes a storage node cluster. The storage node cluster includes one or more storage nodes 20 (where three storage nodes 20a, 20b, and 20c are shown in FIG. 1C, but this is not limited to three storage nodes), and the storage nodes 20 may be interconnected. Each storage node 20 is connected to a plurality of hosts 200. Each host 200 is connected to a plurality of storage nodes 20, and interacts with the plurality of storage nodes 20, so that data is distributed and stored in the plurality of storage nodes 20, to implement reliable storage of the data. Each storage node 20 includes at least a processor 201, a memory 202, and a hard disk 203. Structures and functions of the processor 201, the memory 202, and the hard disk 203 are the same as those of the processor 123, the memory 124, and the hard disk 134 in FIG. 1A. For details, refer to related descriptions in FIG. 1A. Details are not described herein again.

To save storage space of the storage system 120, when storing data to the hard disk 134, the storage system 120 performs data reduction processing. Related technologies used for data reduction include a data compression technology, a deduplication technology, a similar data deletion (delta compression/similarity compression) technology, and the like. The data compression technology reduces redundancy by re-encoding the data, and the deduplication technology implements data reduction by deleting duplicate files or data blocks. Compared with the deduplication technology having a limitation condition that data blocks have to be the same to eliminate redundant data, the similar data deletion technology reduces data blocks that are not completely duplicate but have a specific similarity degree. For example, a data block 1 and a data block 2 cannot be deduplicated because some content is different. However, a similarity degree between the data blocks are high. Therefore, similar compression can be performed on the data block 1 and the data block 2. Specifically, in a related technology, it is assumed that the data block 1 is a to-be-compressed data block. A similar fingerprint of the data block 1 is first extracted, and a data block that has the same similar fingerprint is searched in a database based on the similar fingerprint. After the first data block 2 that has the same similar fingerprint as the data block 1 is found, the data block 2 is used as a reference data block of the data block 1, delta compression is performed on the data block 1 based on the data block 2, and data that is the same as that in the data block 2 is deleted from the data block 1. In addition, the deleted data is pointed to data that is the same as the deleted data and that is in the data block 2, and only data, namely, delta data, of the data block 1 that is different from that in the data block 2 needs to be stored. Therefore, storage space occupied by the data block 1 is reduced. However, in the similarity compression technology, in a case that two data blocks have a same similarity fingerprint, it can only be determined that the two data blocks are similar, but a similarity degree between the two data blocks cannot be distinguished. Therefore, a found reference data block may be a data block whose similarity degree to to-be-compressed data is low, instead of a data block whose similarity degree to the to-be-compressed data is high, to reduce compression efficiency.

Embodiments of this application provide a solution for compressing similar data blocks. In this solution, a plurality of data blocks with a same similar fingerprint are first determined based on similar fingerprints of data blocks, and then a plurality of data blocks with a high similarity degree are grouped from the plurality of data blocks with the same similar fingerprint to perform data compression, to improve data compression efficiency.

Figure 2:
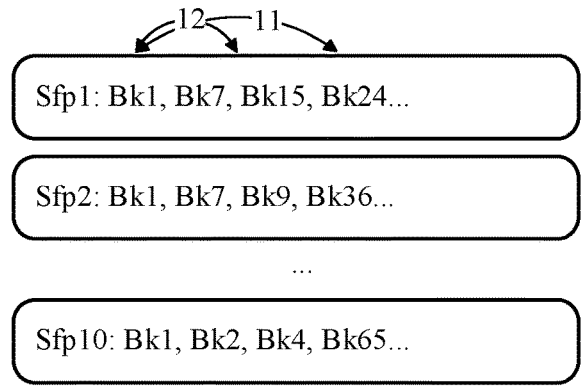
FIG. 2 is a schematic diagram of information about sets of to-be-compressed data blocks that have a same similar fingerprint according to an embodiment of this application.

In the centralized storage system shown in FIG. 1A and FIG. 1B, a data compression solution provided in embodiments of this application is mainly performed by the controller 0 or the controller 1 of the engine 121. In the distributed storage system shown in FIG. 1C, the data compression solution provided in embodiments of this application is mainly performed by the processor in the storage node 20. For ease of description, the following uses an example in which the controller 0 in FIG. 1A performs the data compression solution. As shown in FIG. 2, a memory 124 of a controller 0 stores information about a plurality of sets of to-be-compressed data blocks that have a same similar fingerprint. FIG. 2 schematically shows information about sets of to-be-compressed data blocks with similar fingerprints Sfp1 to Sfp10 respectively. For example, each data block in a set of to-be-compressed data blocks corresponding to the similar fingerprint Sfp1 has the similar fingerprint Sfp1. For example, information about each data block (for example, metadata of the data block) included in the set is recorded in information about the set corresponding to the similar fingerprint Sfp1.

After obtaining a to-be-compressed data block (for example, a data block Bk1), a CPU 123 of the controller 0 may calculate a similar fingerprint and a similar feature of the data block Bk1, and classify, based on the similar fingerprint of the data block Bk1, the data block Bk1 into a set of data blocks corresponding to the similar fingerprint of the data block Bk1. The CPU 123 may calculate a similar fingerprint of a data block in a plurality of known calculating manners. For example, the CPU 123 may calculate the similar fingerprint $Feature_i$ of the data block Bk1 according to the following formula (1):

$$Feature_i = \text{Max}_{j=1}^{N} \{(m_i * \text{Rabin}(W_j) + a_i) \bmod 2^{32}\} \quad (1)$$

In formula (1), a sliding window with a predetermined length (for example, 16 bytes) is used for intercepting content $W_j$ at a plurality of predetermined locations in the data block Bk1, a plurality of corresponding Rabin hashes are calculated, then random prime numbers $m_i$ and $a_i$ are selected to map each Rabin hash value to obtain a plurality of mapping values, and a largest value in the plurality of mapping values is used as the similar fingerprint Feature$_i$ corresponding to a pair of the random prime numbers ($m_i$ and $a_i$). A different i corresponds to a different used pair of random prime numbers, and a different j corresponds to different content intercepted by using the sliding window. The different pair of random prime numbers ($m_i$ and $a_i$) is selected, so that a plurality of similar fingerprints Feature$_i$ can be generated for a same data block.

In another implementation, to improve accuracy of a similar fingerprint, as shown in the following formula (2), a plurality of Feature$_i$ obtained through calculation according to formula (1) are combined into SuperFeature as the similar fingerprint of the data block Bk1:

$$\text{SuperFeature} = \text{Rabin}(\text{Feature}_1, \text{Feature}_2) \qquad (2)$$

Formula (2) schematically shows that after Feature$_1$ and Feature$_2$ of the data block Bk1 are obtained, Feature$_1$ and Feature$_2$ are combined into the similar fingerprint of the data block Bk1 by using a Rabin hash function. It may be understood that embodiments of this application are not limited thereto. Instead, more Feature$_i$ of a data block may be combined to generate a similar fingerprint of the data block.

It is assumed that the CPU 123 calculates, according to formula (1) or formula (2), that similar fingerprints of the data block Bk1 are Spf1, Spf2, and Spf10. The CPU 123 may classify, based on the similar fingerprints of the data block Bk1, the data block Bk1 into sets respectively corresponding to the similar fingerprints of the data block Bk1. For example, after the CPU 123 calculates the similar fingerprint Sfp1 of the data block Bk1, the CPU 123 may determine, from information about the sets corresponding to the similar fingerprints that is stored in the memory, whether information about a set corresponding to Sfp1 is included. If it is determined that the information about the set corresponding to Sfp1 exists, the CPU 123 adds information (for example, an identifier or metadata) about the data block Bk1 to the information about the set corresponding to Sfp1. After the CPU 123 calculates the similar fingerprint Spf2 of the data block Bk1, the CPU 123 may similarly determine whether the information that is about the set and that is in the memory 124 includes information about a set corresponding to Sfp2. It is assumed that it is determined that the information about the set corresponding to Sfp2 does not exist. In this case, the CPU 123 may create, in the memory, the information about the set corresponding to Sfp2, and add the information about the data block Bk1 to the information about the newly created set. Therefore, as shown in FIG. 2, the CPU 123 may record, through the foregoing process, the information about the data block Bk1 into information about three sets of data blocks respectively corresponding to Spf1, Sfp2, and Sfp10.

After calculating a similar fingerprint of the to-be-compressed data block, the CPU 123 may further continue to calculate a data feature of the to-be-compressed data block, where a plurality of data features are features (or feature values) of a plurality of dimensions of the data block. In one implementation, a value corresponding to every n bits that are consecutive and start from a predetermined location or that are separated by a predetermined quantity of bits in the data block may be considered as one element of a vector, so that the data block can be converted to one point in a real number space or one vector in a vector space. Then, the vector is projected to a plurality of one-dimensional subspaces of the vector space, so that a plurality of projection values of the vector can be obtained and used as the feature values of the plurality of dimensions of the data block. In another implementation, a feature (for example, a fingerprint) of a predetermined length of data that is in the data block and that starts from a predetermined location may be obtained as a feature value of the data block. In this way, sampling is performed at a plurality of locations of the data block such that a plurality of feature values of the data block can be obtained. Fingerprints of pieces of data are used for identifying whether the pieces of data are equivalent to each other. In another implementation, a sliding window may be used for sliding in a data block, and values in the sliding window (namely, sliding window values) may be obtained at a plurality of predetermined locations. Then, distribution of a histogram of different sliding window values obtained from the data block is collected, and a plurality of sliding window values that appear most frequently in the histogram are selected as a plurality of data features of the data block. A manner of obtaining the data feature of the data block provided in embodiments of this application is not limited to a specific manner, provided that obtained data features can effectively distinguish a similarity degree between data blocks.

When adding a data block to a set of data blocks, the CPU 123 records metadata of each data block in the set of data block. For example, in a set of a plurality of data blocks with Sfp1, it is recorded that the metadata of the data block Bk1 includes at least an identifier (for example, "Bk1") of the data block, a similar fingerprint (Sfp1) of the data block, a logical block address (LBA) of the data block, and a data feature of the data block.

After the CPU 123 classifies each obtained to-be-compressed data block into a set corresponding to a similar fingerprint as described above, in an implementation, the CPU 123 may aggregate, into a compression group when being idle or at a predetermined period of time, a plurality of data blocks that are in the plurality of sets corresponding to the plurality of similar fingerprints respectively and whose similarity degree meets a specific condition, to compress data blocks in a compression group, and store compressed data in a hard disk 134. In another implementation, after classifying each data block into a set corresponding to a similar fingerprint, the CPU 123 may aggregate, based on the set to which each data block belongs, the data block into a compression group, and compress data in the compression group. The following describes in detail a solution for compressing data blocks in a set corresponding to a similar fingerprint provided in embodiments of this application. In this way, data with a high similarity degree may be placed in a same compression group, and delta compression is performed on all data blocks in the compression group, which can greatly improve data compression efficiency. The following describes a process of compressing data by using the set with reference to FIG. 3.

Figure 3:
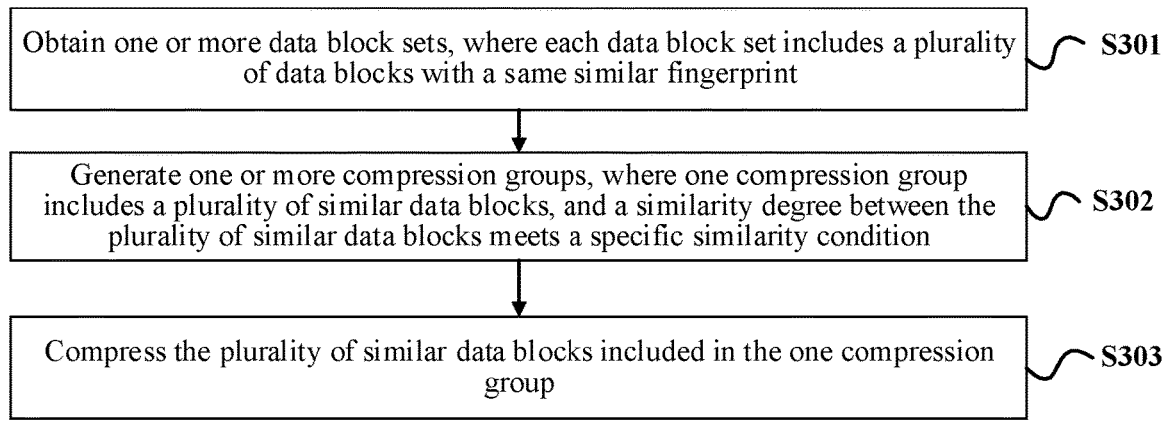
FIG. 3 is a flowchart of a data compression method according to an embodiment of this application.

FIG. 3 is a flowchart of a data compression method according to an embodiment of this application. The method may be performed by the storage system 120 in FIG. 1A, and may be performed by the controller 0 or a CPU 123 of the controller 1 in the storage system 120. The CPU 123 may perform the method shown in FIG. 3 when being idle or at a predetermined period of time, or the CPU 123 may perform the method shown in FIG. 3 after classifying, based on a similar fingerprint of a to-be-compressed data block, the newly obtained to-be-compressed data block into a set shown in FIG. 2.

As shown in FIG. 3, first, in step S301, one or more data block sets in a memory 124 are obtained, where each data block set includes a plurality of data blocks with a same similar fingerprint.

As described above, each time after obtaining a to-be-compressed data block, the CPU 123 classifies the data block into a set corresponding to a similar fingerprint of the data block. Therefore, the CPU 123 may obtain a set of data blocks with a same similar fingerprint based on information that is about a set corresponding to each similar fingerprint and that is stored in the memory 124. In an implementation, when being idle or at the predetermined period of time, the CPU 123 may obtain, based on information that is about sets and that is stored in the memory 124, 10 sets respectively corresponding to similar fingerprints Sfp1 to Sfp10.

In step S302, one or more compression groups are generated based on a similarity degree between a plurality of data blocks included in each data block set, where one compression group includes a plurality of similar data blocks, the plurality of similar data blocks are a subset of data blocks included in the one or more data block sets, and a similarity degree between the plurality of similar data blocks meets a specific similarity condition.

For a plurality of data blocks included in one data block set, the CPU 123 may determine a similarity degree between every two data blocks by using any known similarity degree determining method. Therefore, the data blocks included in the one or more data block sets may be grouped based on the similarity degree between the plurality of data blocks included in each data block set in the one or more data block sets, to obtain the one or more compression groups.

In one implementation, the CPU 123 may determine the similarity degree between every two data blocks based on a plurality of data features of each data block. A larger quantity of data features the two data blocks share, a higher similarity degree between the two data blocks may be determined.

After obtaining the one or more data block sets, the CPU 123 may obtain metadata of each data block in the one or more data block sets from information about the one or more data block sets, and determine, based on a plurality of data features that are of each data block and that are included in the metadata of each data block, a similarity degree between every two data blocks in one data block set.

In this embodiment of this application, each data block has a same quantity of, for example, 12, data features. When determining a similarity degree between data blocks, the CPU 123 first searches for two data blocks that share 12 data features, and then searches for two data blocks that share 11 data features, until two data blocks that share one data feature are found. In a process of searching, data blocks share more data features form a compression group.

For example, as shown in FIG. 2, for a set corresponding to Sfp1, the CPU 123 may determine a similarity degree between two data blocks in the following pairs of data blocks: Bk1-Bk7, Bk1-Bk15, Bk1-Bk24, . . . , Bk7-Bk15, Bk7-Bk24, . . . , Bk15-Bk24, and so on. Specifically, when a similarity degree between a data block Bk1 and a data block Bk7 is determined, it is assumed that each data block has 12 data features F1 to F12. If 12 data features $F1_{BK1}$ to $F12_{BK1}$ of the data block Bk1 are all the same as 12 data features $F1_{BK7}$ to $F12_{BK7}$ of the data block Bk7, it may be determined that the similarity degree between the data block Bk1 and the data block Bk7 is 12. When a similarity degree between the data block Bk1 and a data block Bk15 is determined, and if 11 data features in metadata of the data block Bk1 are equal to 11 data features in metadata of the data block Bk15, it may be determined that the similarity degree between the data block Bk1 and the data block Bk15 is 11.

After determining a similarity degree between every two data blocks in a set for each of the one or more sets, the CPU 123 may group, based on the similarity degree, data blocks included in the plurality of sets. In order to increase a reduction ratio of data compression, data blocks with a similarity degree as high as possible need to be grouped into one compression group. In addition, for convenience of decompressing data when the data is read, a quantity of data blocks included in the compression group needs to be controlled to a predetermined quantity (which is denoted as a value of m below).

In an implementation, the CPU 123 obtains, from the memory 124, 10 data block sets respectively corresponding to Sfp1 to Sfp10. Then, the CPU 123 groups, based on a similarity degree between data blocks in each set, a plurality of data blocks included in the 10 sets.

Figure 4:
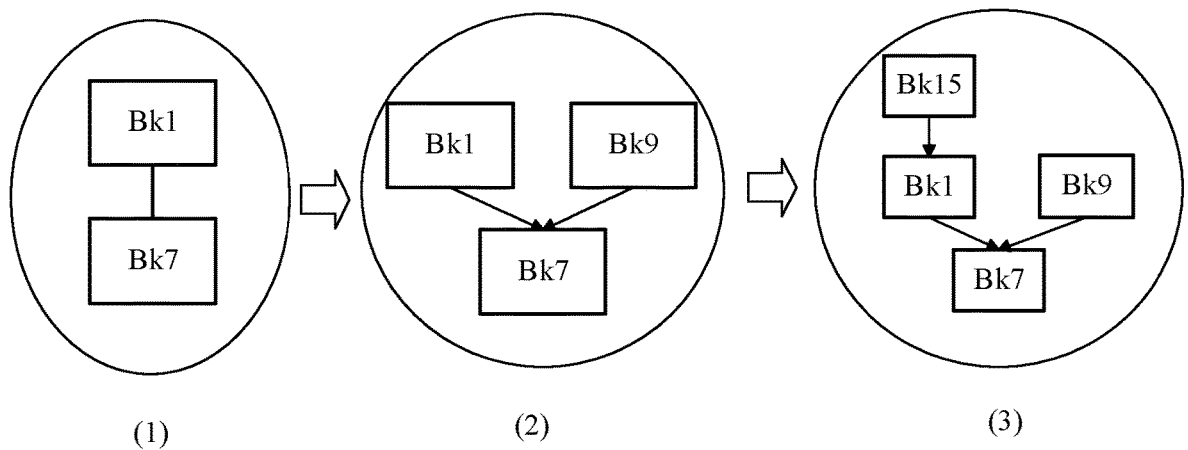
FIG. 4 is a schematic diagram of content included in information about a compression group according to an embodiment of this application.

Specifically, the CPU 123 first searches each set for a pair of data blocks sharing 12 data features, and groups, into a same compression group, the pair of data blocks sharing the 12 data features. For example, with reference to FIG. 2, first, data blocks Bk1 and Bk7 sharing 12 data features are determined in a set corresponding to Spf1. The CPU 123 then determines whether a compression group including the data block Bk1 and/or the data block Bk7 already exists. The CPU 123 may determine, by searching for information that is about a compression group and that is stored in the memory 124, whether the foregoing compression group exists. It is assumed that a result of the foregoing determining is no, the CPU 123 combines the data block Bk1 and the data block Bk7 into a compression group (which is marked as a compression group G1 below). Specifically, the CPU 123 creates information about the compression group G1 including the data block Bk1 and the data block Bk7, and stores the information in the memory 124. The information about the compression group may include information (for example, an identifier or metadata) about the data block Bk1 and information about the data block Bk7, and may store the information about the data block Bk1 in association with the information about the data block Bk7. FIG. 4 is a schematic diagram of content included in the information about the compression group G1. In an ellipse indicated by "(1)" in FIG. 4, the information about the data block Bk1 may be associated with the information about the data block Bk7, to indicate that there is a specific similarity degree between the data block Bk1 and the data block Bk7.

Then, the CPU 123 searches the foregoing 10 sets for a next pair of data blocks sharing 12 data features. For example, the CPU 123 searches for, based on a set corresponding to Sfp2, the data block Bk7 and a data block Bk9 sharing the 12 data features. Similarly, after determining that the compression group G1 including the data block Bk7 already exists, the CPU 123 determines that a quantity of data blocks included in the compression group G1 is less than m (for example, m may be set to 8) and does not include the data block Bk9. In this case, the data block Bk9 is added to the compression group G1, and the information about the data block Bk7 is associated with information about the data block Bk9 in the information about the compression group G1. With reference to a circle indicated by "(2)" in FIG. 4, after the data block Bk9 is added to the compression group G1, because the data block Bk1 and the data block Bk9 each have a similarity degree equal to 12 to the data block Bk7, in the information about the compression group G1, an association relationship (which is indicated by an arrow) from the information about the data block Bk1 to the information about the data block Bk7 and an association relationship (which is indicated by an arrow) from the information about the data block Bk9 to the information about the data block Bk7 may be marked, to indicate that the data block Bk7 is used as a header block of a plurality of data blocks in the compression group, the similarity degree between the data block Bk7 and the data block Bk1 meets a specific degree, and the similarity degree between the data block Bk7 and the data block Bk9 meets a specific degree. The data block Bk7 is the most similar data block to the data block Bk1 and the most similar data block to the data block Bk9 in the compression group. The data block Bk1 and the data block Bk9 may be compressed by using the data block Bk7 as a reference data block.

After adding the data block Bk9 to the compression group G1, the CPU 123 searches for, in the foregoing 10 sets, whether there is another pair of data blocks sharing 12 data features. It is assumed that a result of the determining is no, to be specific, the CPU 123 finishes searching for, in the 10 sets, the pair of data blocks sharing the 12 data features. In this case, the CPU 123 starts searching for, based on the 10 sets corresponding to Sfp1 to Sfp10, a pair of data blocks sharing 11 data features. It is assumed that, as shown in FIG. 2, the data block Bk1 and the data block Bk15 are determined to share 11 data features. In this case, the CPU 123 determines whether there is a group including identifiers/an identifier of the data block Bk1 and/or the data block Bk15. Based on the information about the compression group G1 shown in (2) in FIG. 4, it may be obtained that a result of the determining is yes. Therefore, after determining that the quantity of data blocks included in the compression group G1 is less than m and the compression group G1 does not include the data block Bk15, the CPU 123 adds the data block Bk15 to the compression group G1. As shown by a circle indicated by "(3)" in FIG. 4, after the data block Bk15 is added to the compression group G1, because the data block Bk7 has been determined as the header block, in the information about the compression group G1, an association relationship (which is indicated by an arrow) from information about the data block Bk15 to the information about the data block Bk1 may be marked, to indicate that a similarity degree between the data block Bk1 and the data block Bk15 meets a specific degree, and the data block Bk1 is a data block most similar to the data block Bk15 in the compression group.

After finishing searching for, in the 10 sets, a pair of data blocks sharing 11 data features, the CPU 123 may start searching for, based on the 10 sets corresponding to Sfp1 to Sfp10, a pair of data blocks sharing 10 data features, to perform grouping. In this way, 12 rounds of traversal can be performed on the sets corresponding to Sfp1 to Sfp10 in total, so that the data blocks in the sets corresponding to Sfp1 to Sfp10 are grouped in descending order of similarity degrees between the data blocks in the sets. That is, the pair of data blocks sharing 12 data features is preferentially aggregated into one or more compression groups. After all pairs of data blocks that share the 12 data features and that are in the foregoing 10 sets are grouped into the compression group, and in a case that a quantity of data blocks in each compression group does not reach a predetermined quantity, the pair of data blocks sharing 11 data features is aggregated into one or more compression groups. This ensures that data blocks in one or more compression groups that are finally provided have a similarity degree as high as possible. Therefore, a data reduction ratio can be improved when data blocks in a compression group are compressed.

It may be seen from the information about the compression group G1 shown in FIG. 4(3) that an association relationship between a plurality of data blocks included in the compression group G1 forms an association relationship tree, and a data block Bk7 is on a root node of the tree. The data block Bk7 includes a data block Bk1 and a data block Bk9 on child nodes respectively, and the data block Bk1 has a data block Bk15 on a child node. The association relationship tree includes at least one logical chain, and the logical chain is not a real connection between data blocks, but only reflects an association relationship between data blocks. A similarity degree between two adjacent data blocks on the logical link reaches a specific degree. Further, the two adjacent data blocks on the logical link share P data features, and P may be, for example, any value from 1 to 12.

It may be understood that the foregoing manner of generating a compression group is merely an example, and is not intended to limit the scope of this embodiment. In an implementation, to speed up the aggregation, data blocks sharing 12 to 10 data features may be first aggregated into a compression group, then data blocks sharing 9 to 7 data features may be aggregated into a compression group, and so on.

In another implementation, a threshold of a similarity degree may be set for each compression group. For example, for a compression group with a highest similarity degree, only data blocks sharing at least five data features may be set to be aggregated into the compression group. In this implementation, if a pair of data blocks, Bk9 and Bk36, sharing four data features is found in one set, because a similarity degree between the data block Bk9 and the data block Bk36 does not reach the threshold (namely, 5), the data block Bk36 is not added to the compression group G1.

Figure 5:
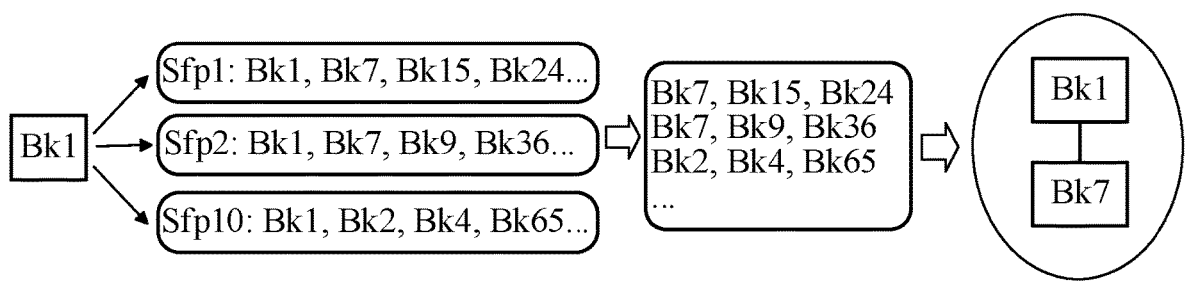
FIG. 5 is a schematic diagram of a process of grouping to-be-compressed data blocks in real time according to an embodiment of this application.

The foregoing manner of generating a compression group is as follows: The compression group is not formed in real time for a to-be-compressed data block. Instead, the to-be-compressed data block is first recorded in a data block set, and the compression group is formed when a storage system is idle or at a predetermined period of time, to compress the to-be-compressed data block. In an embodiment of this application, another manner of compressing a to-be-compressed data block in real time is further provided. Further, FIG. 5 is a schematic diagram of a process of grouping to-be-compressed data blocks in real time according to an embodiment of this application. After obtaining a data block Bk1 and classifying, based on a similar fingerprint of the data block Bk1, the data block Bk1 into three sets respectively corresponding to similar fingerprints Sf1, Sp2, and Sfp10, a CPU 123 obtains all data blocks included in the three sets. Then, the CPU 123 may find, from all the data blocks of the three sets, a data block (for example, a data block Bk7) that shares the most similar features with the to-be-compressed data block. If it is determined that the data block Bk7 is not grouped to another compression group, the data block Bk1 and the data block Bk7 may be combined into one compression group. If it is determined that the data block Bk7 has been grouped to another compression group, the data block Bk1 may be added to the compression group to which the data block Bk7 belongs.

It should be noted that, in addition to foregoing two data block aggregation methods based on data features, a data block aggregation method based on another similarity degree determining manner is also included within the scope of this embodiment of this application. For example, in one implementation, a similarity degree between two data blocks may be determined by comparing editing distances of the two data blocks. The editing distance indicates a minimum quantity of operations of evolving from one string (which corresponds to one data block) to another string. The shorter the editing distance, the smaller a difference between the two data blocks, and the higher a similarity degree. Therefore, this can be used as a method for measuring a similarity degree between data blocks. In another implementation, a similarity degree between two data blocks may be determined by comparing Hamming distances of similarity hash values of the data blocks. The similarity hash value can save similarity between data blocks themselves with a specific probability. The higher the similarity of the data blocks themselves, a greater probability that the similarity hash values are the same. After the similarity hash values are calculated, the Hamming distances of the two similarity hash values may be compared. A shorter distance indicates higher similarity between the data blocks. Therefore, this can also be used as a method for measuring a similarity degree between data blocks. In another implementation, a similarity degree between two data blocks may be determined by using a reduction gain of compressing similar data blocks. More data can be reduced by compressing the two data blocks together. This indicates higher redundancy, that is, a higher similarity degree, between the two data blocks. In addition, in this embodiment of this application, data blocks may be further clustered by using a clustering algorithm, to aggregate a plurality of data blocks with a high similarity degree.

After one or more compression groups are generated as described above, as shown in FIG. 3, step S303 may be performed, to compress a plurality of similar data blocks included in one compression group. The compression group is, for example, a compression group shown in a circle indicated by "(3)" in FIG. 6. A compression group provided by the method for providing a compression group described above includes a plurality of data blocks with a similarity degree as high as possible, and one or more compression groups finally obtained include a plurality of data blocks with a highest similarity degree among 10 sets shown in FIG. 2. In this way, the plurality of data blocks included in the compression group are compressed, so that a large amount of redundant data can be removed, and a data reduction ratio can be improved.

Figure 6:
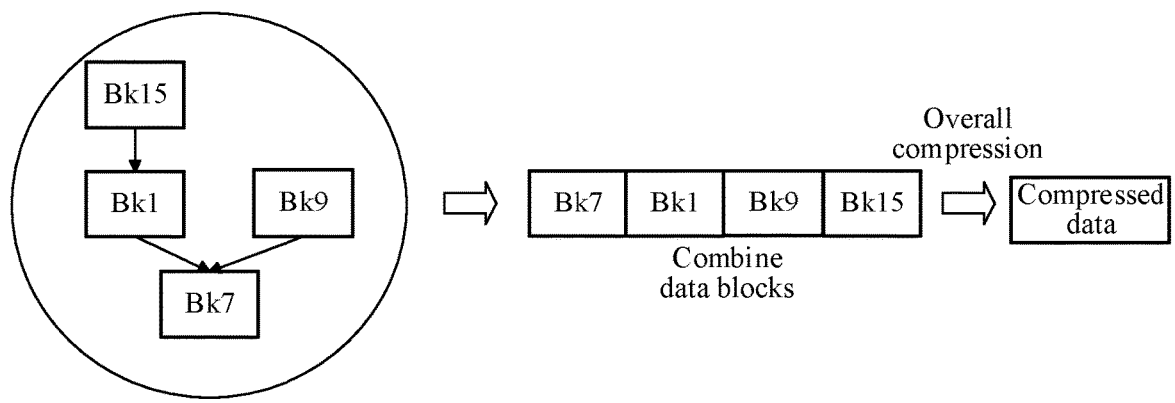
FIG. 6 is a schematic diagram of a process of compressing a plurality of data blocks in a compression group according to an embodiment of this application.

FIG. 6 is a schematic diagram of a process of compressing a plurality of data blocks in a compression group G1 according to an embodiment of this application. As shown in FIG. 6, data content of four data blocks Bk7, Bk1, Bk9, and Bk15 in the foregoing obtained compression group G1 may be obtained, the data content of the four data blocks Bk7, Bk1, Bk9, and Bk15 may be spliced together to form a combined data block, and overall compression is performed on the combined data block, to obtain compressed data. When the four data blocks are spliced, the four data blocks may be arranged in an order of sizes of LBAs, or may be arranged based on similarity degrees between the data blocks and most similar data blocks of the data blocks respectively, or may be arranged based on sizes of similar fingerprints of the data blocks. This is not limited herein. For example, in FIG. 6, a header block Bk7 is arranged first, a similarity degree between a data block Bk1 and the data block Bk7 may be expressed as 12 based on data features of the data block Bk1 and the data block Bk7, a similarity degree between a data block Bk9 and the data block Bk7 may be expressed as 12, and a similarity degree between a data block Bk15 and the data block Bk1 may be expressed as 11. Therefore, the data block Bk1 and the data block Bk9 are arranged after the data block Bk7 based on the similarity degrees between the data blocks and most similar data blocks of the data blocks respectively, and the data block Bk15 is arranged after the data block Bk9. In the foregoing process of aggregating data blocks to the compression group G1, data of all data blocks in the current group G1 may be read in real time each time one data block is added, to perform a compression process described in FIG. 6. Alternatively, it may be set that only when a quantity of data blocks in the group G1 meets a condition, for example, when the quantity of data blocks in the group G1 is greater than four data of a data block is read for compression, to reduce a quantity of times of compression and a quantity of times of data reading.

Figure 7:
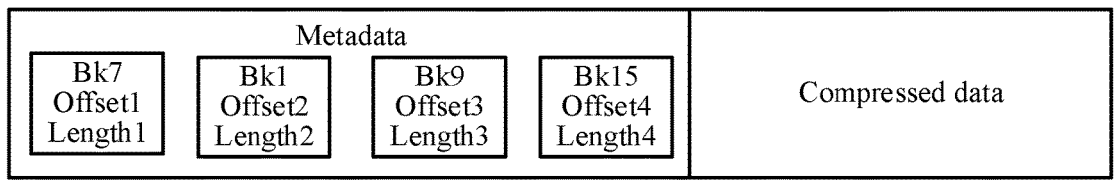
FIG. 7 is a schematic diagram of metadata of compressed data according to an embodiment of this application.

After the compressed data is generated by using the process shown in FIG. 6, metadata of the compressed data is further generated. FIG. 7 is a schematic diagram of metadata of compressed data. As shown in FIG. 7, the metadata includes compression information respectively corresponding to data blocks Bk7, Bk1, Bk9, and Bk15. For example, compression information of the data block Bk7 includes Offset1 and Length1, where Offset1 is a start offset address of the data block Bk7 in original data, and Length1 is a length of the data block Bk7 in the original data. It may be understood that the metadata shown in FIG. 7 is merely an example, and may also have another form. For example, if each data block in a compression group G1 has a predetermined size (for example, 8 KB), only an arrangement order of the data blocks Bk7, Bk1, Bk9 and Bk15 may be included in the metadata. After generating the compressed data and the metadata of the compressed data as shown in FIG. 7, a CPU 123 stores the compressed data and the metadata of the compressed data into a hard disk 134. The metadata is for decompressing the compressed data.

Figure 8:
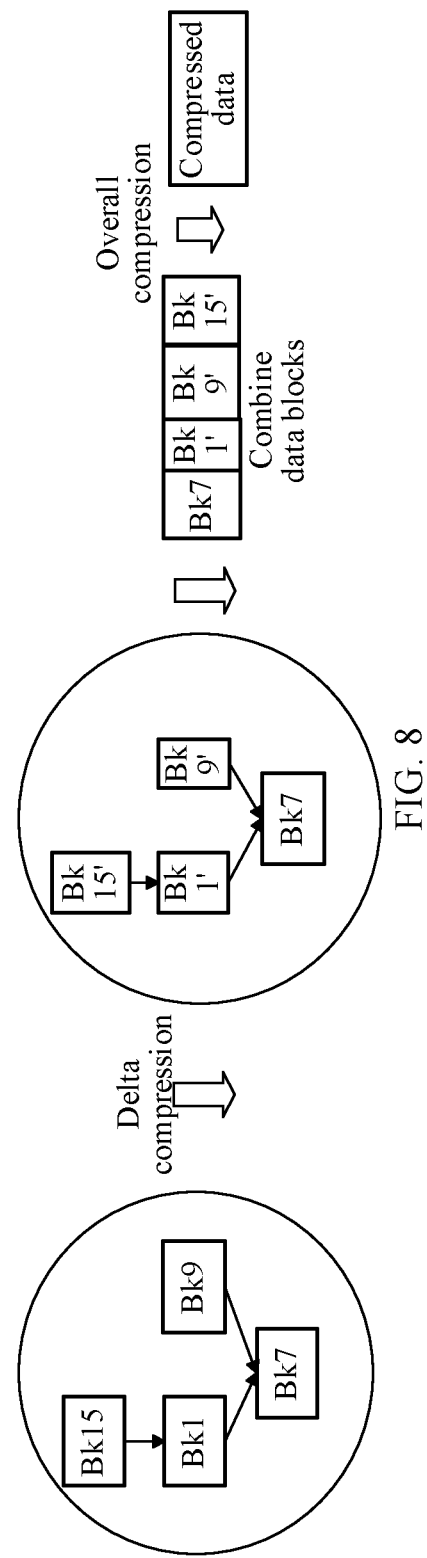
FIG. 8 is a schematic diagram of another process of compressing a plurality of similar data blocks in a compression group according to an embodiment of this application.
Figure 9:
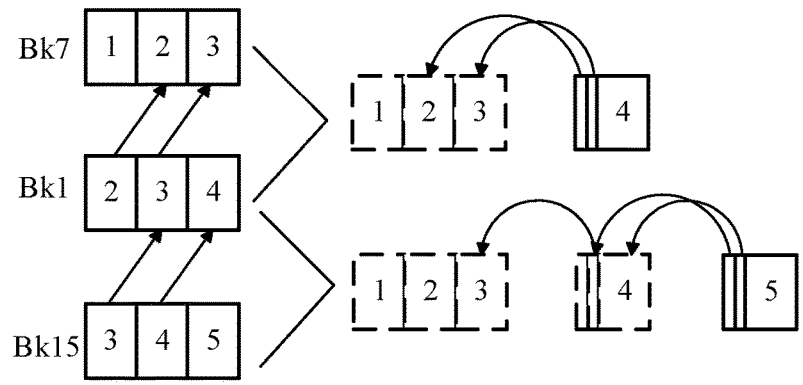
FIG. 9 is a schematic diagram of a process of performing delta compression on a data block according to an embodiment of this application.

FIG. 8 is a schematic diagram of another process of compressing a plurality of similar data blocks in a compression group G1 according to an embodiment of this application. As shown in FIG. 8, a process of compressing data blocks in the compression group G1 may be divided into two phases. In a first phase, based on a tree similarity relationship between the data blocks in the compression group G1, for a data block on any child node in the tree relationship, delta compression is performed on the child node by using a data block on a parent node of the child node as a reference data block, to perform delta compression on all data blocks in the compression group except a header block Bk7. Further, the delta compression is separately performed on a data block Bk1 and a data block Bk9 by using the data block Bk7 as a reference data block, and the delta compression is performed on a data block Bk15 by using the data block Bk1 as a reference data block. FIG. 9 is a schematic diagram of a process of separately performing delta compression on a data block Bk1 and a data block Bk15. As shown in FIG. 9, it is assumed that a data block Bk7 includes data 1 to 3, the data block Bk1 includes data 2 to 4, and the data block Bk15 includes data 3 to 5. After the delta compression is performed on the data block Bk1 with reference to the data block Bk7, the data 2 and the data 3 in the data block Bk1 are deleted, and pointers are used for pointing to the data 2 and the data 3 in the data block Bk7 respectively at locations of the data 2 and the data 3 in the data block Bk1. After the delta compression is performed on the data block Bk15 with reference to the data block Bk1, the data 3 and the data 4 in the data block Bk15 are deleted, a pointer is used for pointing to the data 3 in the data block Bk1 at a location of the data 3 in the data block Bk15 (that is, the pointer in data block Bk1 is used for pointing to the data 3 in the data block Bk7), and a pointer is used for pointing to the data 4 in the data block Bk1 at a location of the data 4 in the data block Bk15. That is, after the delta compression is separately performed on the data block Bk1 and the data block Bk15, the data block Bk1 is left with only the data 4 as delta data of the data block Bk1 relative to the data block Bk7, and the data block Bk15 is left with only the data 5 as delta data of the data block Bk15 relative to the data block Bk1.

As shown in FIG. 8, it is assumed that each data block initially included in the compression group G1 has a size of 8 KB. After the foregoing delta compression is performed, the data block Bk1 is compressed into, for example, a data block Bk1' of 2 KB (which indicates the delta data of the data block Bk1 relative to the data block Bk7), the data block Bk9 is compressed into, for example, a data block Bk9' of 3 KB (which indicates delta data of the data block Bk9 relative to the data block Bk7), and the data block Bk15 is compressed into, for example, a data block Bk15' of 5 KB (which indicates the delta data of the data block Bk15 relative to the data block Bk1).

In a second phase, the data block Bk7, the data block Bk1', the data block Bk9', and the data block Bk15' may be combined and spliced into a combined data block, and then overall compression is performed on the combined data block, to obtain compressed data. The compression in the second phase is an optional step. If there is no compression of the combined data block in the second phase, high compression efficiency can also be obtained through the compression in the first phase. In the foregoing process of aggregating data blocks to the compression group G1, the delta compression may be performed in real time each time one data block is added. Alternatively, it may be set that only when a quantity of data blocks in the compression group G1 meets a condition, for example, when the quantity of data blocks in the compression group G1 is greater than four, the delta compression starts to be performed, to reduce a quantity of times of compression and a quantity of times of data reading.

Figure 10:
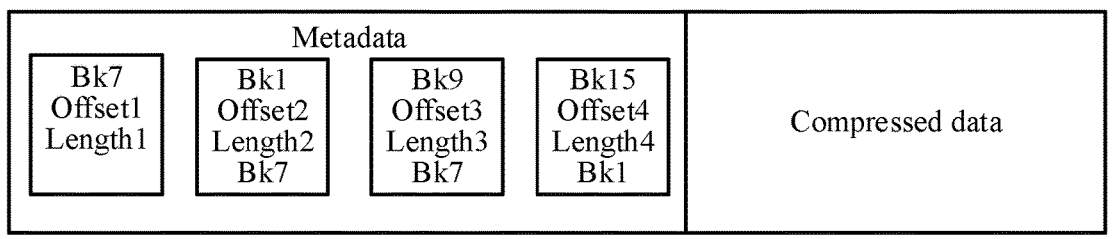
FIG. 10 is a schematic diagram of metadata of compressed data according to an embodiment of this application.

After the compressed data is generated by using the process shown in FIG. 8, metadata of the compressed data is further generated. FIG. 10 is a schematic diagram of metadata of compressed data. As shown in FIG. 10, the metadata includes compression information corresponding to data blocks Bk7, Bk1, Bk9, and Bk15 respectively. For example, compression information of the data block Bk7 includes Offset1 and Length1, where Offset1 is a start offset address of the data block Bk7 in the combined data block in FIG. 8, and Length1 is a length of the data block Bk7 in the combined data block; and compression information of the data block Bk1 includes Offset2, Length2, and Bk7, where Offset2 is a start offset address of a data block Bk1' in the combined data block in FIG. 8, Length2 is a length of the data block Bk1' in the combined data block, and "Bk7" in the compressed information indicates that a reference data block of Bk1 is the data block Bk7, that is, Bk1' is delta data of the data block Bk1 relative to the data block Bk7.

Figure 11:
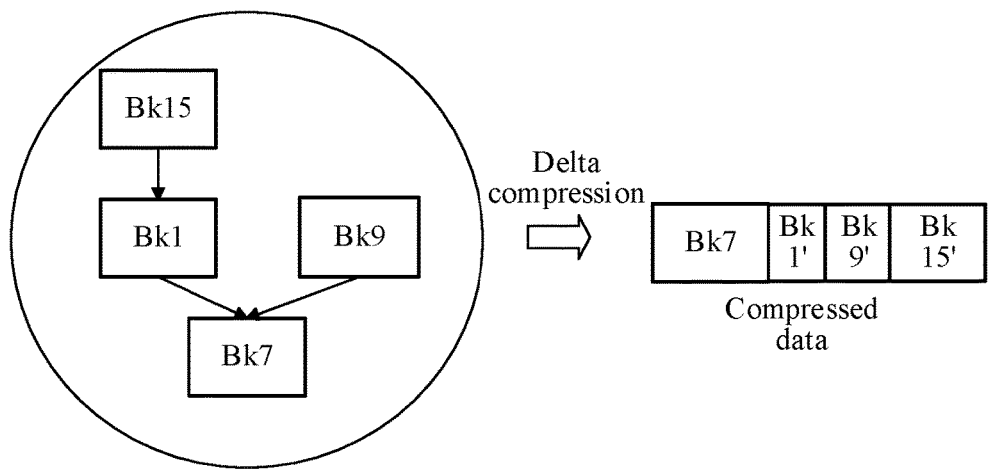
FIG. 11 is a schematic diagram of still another process of compressing a plurality of data blocks in a compression group according to an embodiment of this application.

FIG. 11 is a schematic diagram of another process of compressing a plurality of data blocks in a compression group G1 according to an embodiment of this application. As shown in FIG. 11, delta compression is performed on all data blocks except a header block in the compression group G1 to obtain compressed data. In the process shown in FIG. 11, a multi-reference delta compression manner may be used. To be specific, based on a tree similarity relationship between the data blocks in the compression group G1, all other data blocks from a node on which a data block is located to a root node may be used as reference data blocks to compress the data block. Further, for example, when the delta compression is performed on a data block Bk15, both a data block Bk7 and a data block Bk1 are used as reference data blocks of the data block Bk15. Because the data block Bk1 and the data block Bk7 have a high similarity degree, and the data block Bk1 and the data block Bk15 have a high similarity degree, the data block Bk7 and the data block Bk15 also have to have a high similarity degree. Therefore, the data block Bk15 is compressed by using both the data block Bk7 and the data block Bk1 as the reference data blocks of the data block Bk15 such that an actual compression effect is better than an effect in which only the data block Bk1 is used as a reference data block, and a data reduction ratio is improved.

Figure 12:
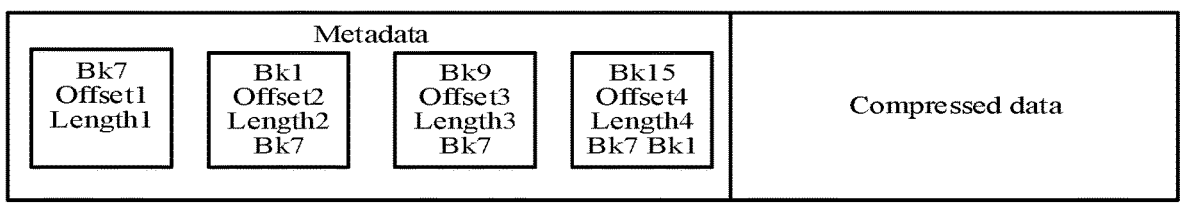
FIG. 12 is a schematic diagram of metadata of compressed data according to an embodiment of this application.

After the compressed data of the compression group G1 is generated through the multi-reference delta compression, metadata of the compressed data as shown in FIG. 12 may be generated. A difference from the metadata shown in FIG. 10 is that, in the compression information of the data block Bk15, "Bk7 Bk1" is included in a last row, and indicates that the data block Bk7 and the data block Bk1 are used as the reference data blocks of the data block Bk15.

Figure 13:
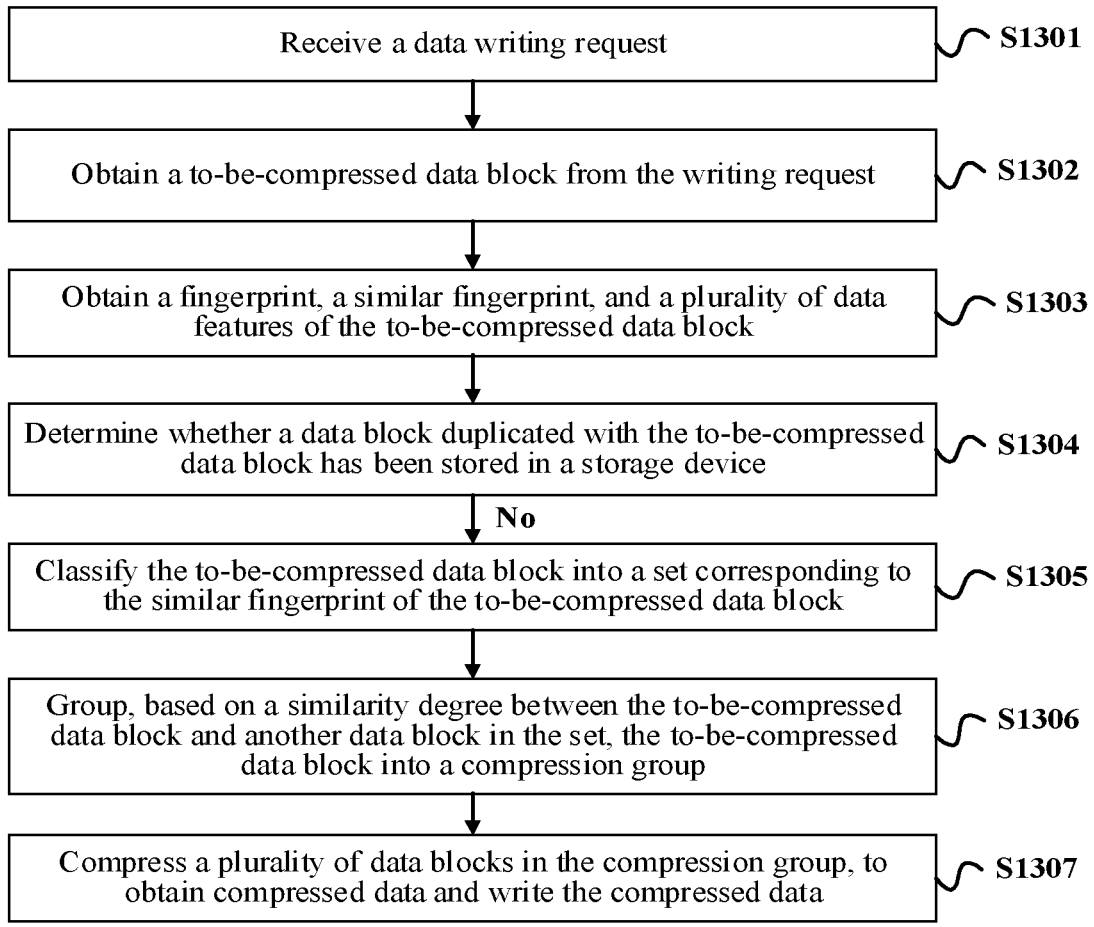
FIG. 13 is a flowchart of a method for writing data into a storage system according to an embodiment of this application.

FIG. 13 is a flowchart of a method for writing data into a storage system according to an embodiment of this application. For example, the method is performed by the controller 0 in the storage system 120 in FIG. 1A or FIG. 1B, or may be performed by the processor of any storage node 20 in FIG. 1C. For ease of description, the following mainly uses an example in which the controller 0 in FIG. 1A performs the method shown in FIG. 13.

As shown in FIG. 13, first, in step S1301, a data writing request is received.

When data is expected to be written into the storage system 120, a host 200 may send the data writing request to the storage system 120. The data writing request includes the to-be-written data, so that the storage system 120 can receive the data writing request from the host 200.

In step 1302, after the storage system 120 receives the data writing request, a CPU 123 divides the to-be-written data of the writing request into at least one data block (which includes, for example, a data block Bk1) of a predetermined size.

In step S1303, the CPU 123 obtains a fingerprint, a similar fingerprint, and a plurality of data features of a to-be-compressed data block.

The fingerprint is used for determining whether another data block that is the same as the data block exists. If fingerprints of two data blocks are the same, it may be determined that the two data blocks are the same data block. The similar fingerprint and the data feature are described above, and details are not described herein again.

In step S1304, the CPU 123 determines whether a data block duplicated with the to-be-compressed data block has been stored in the storage system.

The CPU 123 may record, in a memory or a persistent medium, a fingerprint of a data block that has been stored in a memory 124 or a hard disk 134 and information about the data block corresponding to the fingerprint. After calculating a fingerprint of the data block Bk1, the CPU 123 may determine, based on information about the recorded fingerprint, whether the information about the recorded fingerprint includes the fingerprint of the data block Bk1. If the information about the recorded fingerprint includes the fingerprint of the data block Bk1, it indicates that the storage system already stores a data block that is the same as the data block Bk1. Therefore, the CPU 123 may enable the disk 134 to not store content included in the data block Bk1, but point, by using a pointer, the data block Bk1 to the data block corresponding to the information about the fingerprint. That is, original data needs to be stored only once for data blocks with a same fingerprint in the disk 134.

If it is determined that the information about the recorded fingerprint does not include the fingerprint of the data block Bk1, it indicates that no data block duplicated with the data block Bk1 is stored in the storage system. Therefore, the CPU 123 records the fingerprint of the data block Bk1 and information about the data block Bk1 corresponding to the fingerprint in the memory or the persistent medium, and performs step S1305, to classify the to-be-compressed data block Bk1 into a set corresponding to a similar fingerprint of the to-be-compressed data block Bk1. For this step, refer to the foregoing description, and details are not described herein again.

Thereafter, the CPU 123 may perform step S1306, to group the data block Bk1 into a compression group based on a similarity degree between the to-be-compressed data block Bk1 and another data block in the set into which the to-be-compressed data block Bk1 is classified. As described above with reference to FIG. 3, if the data block Bk1 and the another data block in the set into which the to-be-compressed data block Bk1 is classified share at least M data features, the data block Bk1 may be grouped into the compression group, and a subsequent step S1307 may be performed, where M is less than or equal to a quantity of all, for example, 12, data features of a data block, and is greater than or equal to a predetermined threshold, and the threshold may be set to a minimum of 1. If the data block Bk1 does not meet the foregoing condition, the data block Bk1 is separately compressed.

In step S1307, the CPU 123 compresses a plurality of data blocks in the compression group, to obtain compressed data and write the compressed data.

For a compression process of this step, refer to the foregoing description of step S303 in FIG. 3. Details are not described herein again.

After obtaining the compressed data corresponding to the compression group, the CPU 123 may temporarily store the compressed data in the memory 124, and when a total amount of data in space of the memory 124 reaches a specific threshold, the CPU 123 sends the compressed data stored in the memory 124 to a control unit 131, to store the compressed data in the hard disk 134 persistently, or the CPU 123 may write the compressed data to the hard disk 134 immediately after obtaining the compressed data. In the storage system shown in FIG. 1B, after obtaining the compressed data, the CPU 123 may directly write the compressed data to the hard disk 134.

In the distributed storage system shown in FIG. 1C, when the host 200 needs to write data into the storage system, the host 200 sends a data writing request to a corresponding storage node (for example, the storage node 20a) based on a correspondence between the data and a storage node, so that the storage node 20a can perform the method shown in FIG. 13, and write the compressed data to a hard disk of a local storage node or another storage node after obtaining the compressed data.

Figure 14:
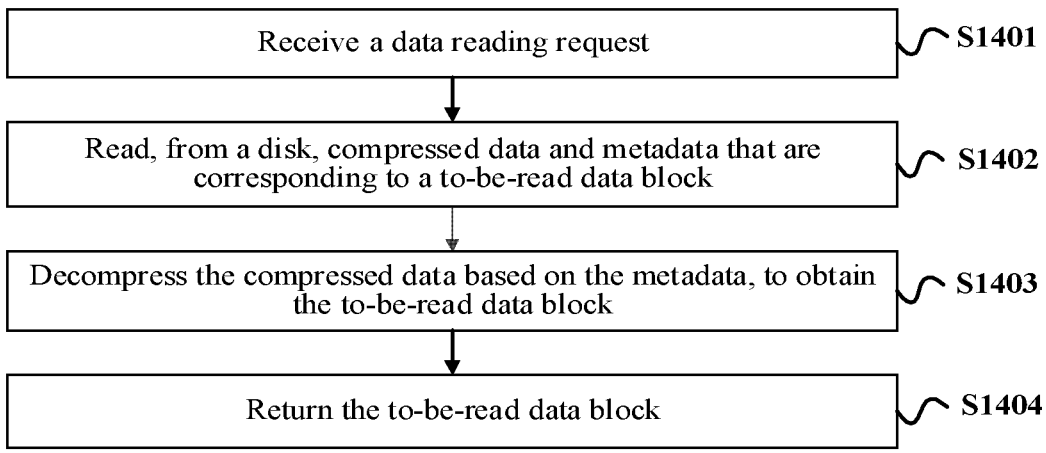
FIG. 14 is a flowchart of a method for reading data from a storage system according to an embodiment of this application.

FIG. 14 is a flowchart of a method for reading data from a storage system according to an embodiment of this application. For example, the method is performed by the controller 0 in the storage system 120 in FIG. 1A or FIG. 1B, or may be performed by the processor of any storage node 20 in FIG. 1C. For ease of description, the following mainly uses an example in which the controller 0 in FIG. 1A performs the method shown in FIG. 14.

With reference to FIG. 14, in step S1401, a data reading request is received.

The storage system 120 may receive the data reading request from a host 200. The data reading request includes, for example, an address of to-be-read data. If the to-be-read data may correspond to one or more to-be-read data blocks, the address of the to-be-read data may correspond to a storage address of compressed data corresponding to the one or more to-be-read data blocks.

In step S1402, a CPU 123 reads, from a disk 134, compressed data corresponding to a to-be-read data block and meta-data of the compressed data.

After the storage system 120 receives a reading request for, for example, a data block Bk15 from the host 200, the CPU 123 may send the reading request to a control unit 131 such that the control unit 131 reads, from a hard disk 134 and based on a reading address in the reading request, compressed data corresponding to the data block Bk15 and meta-data of the compressed data, and sends the compressed data and the metadata to the CPU 123. In the storage system 120 shown in FIG. 1B, the CPU 123 may directly read data from the hard disk 134 based on the received reading request.

In step S1403, the CPU 123 decompresses the compressed data based on the metadata, to obtain the to-be-read data block.

In an implementation, the metadata is the metadata shown in FIG. 7. After obtaining the compressed data and the metadata of the compressed data, the CPU 123 first decompresses the compressed data to obtain the combined data block in FIG. 6, and obtain the to-be-read data block Bk15 from the combined data block based on Offset4 and Length4 that are of the data block Bk15 and that are recorded in the metadata.

In another implementation, the metadata is the metadata shown in FIG. 10. After obtaining the compressed data and the metadata of the compressed data, the CPU 123 first decompresses the compressed data to obtain the combined data block in FIG. 8, first obtains data Bk7 of Offest1 and Length1 and data Bk1' of Offest2 and Length2 from the combined data block based on the metadata, recovers a data block Bk1 by using a data block Bk7 as a reference data block and using the data Bk1' as delta data, then obtains data Bk15' of Offest4 and Length4 from the combined data block, and recovers the data block Bk15 by using the data block Bk1 as a reference data block and using the data Bk15' as delta data.

In another implementation, the metadata is the metadata shown in FIG. 12. After obtaining the compressed data and the metadata of the compressed data, the CPU 123 first obtains the data Bk7 of Offest1 and Length1 and the data Bk1' of Offest2 and Length2 from the compressed data, recovers the data block Bk1 by using the data block Bk7 as the reference data block and using the data Bk1' as the delta data, then obtains the data Bk15' of Offest4 and Length4 from the combined data block, and recovers the data block Bk15 by using the data blocks Bk7 and Bk1 as reference data blocks and using the data Bk15' as the delta data.

In step S1404, after obtaining the to-be-read data block Bk15, the storage system 120 returns the to-be-read data block Bk15 to the host 200 by using the CPU 123.

In the distributed storage system shown in FIG. 1C, the host 200 may send, based on a correspondence between the data and a storage node, a data reading request to a storage node (for example, the storage node 20a) that stores the to-be-read data such that the processor in the storage node 20*a* can perform the method shown in FIG. 14, and return the to-be-read data to the host 200 after obtaining the to-be-read data.

Figure 15:
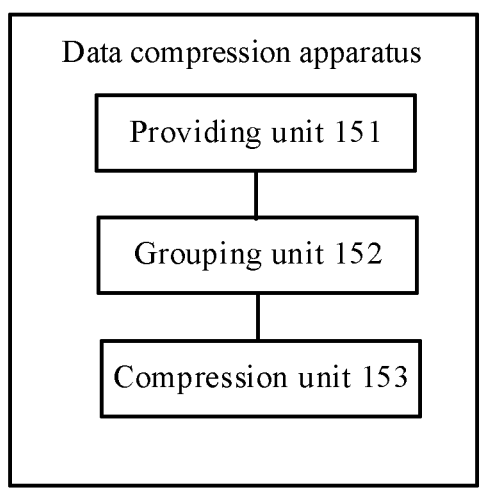
FIG. 15 is an architectural diagram of a data compression apparatus according to an embodiment of this application.

FIG. 15 is an architectural diagram of a data compression apparatus according to an embodiment of this application. The data compression apparatus is configured to perform the method shown in FIG. 3, and the data compression apparatus includes a providing unit 151 configured to perform step S301 in the data compression method shown in FIG. 3, and provide one or more data block sets, where each data block set includes a plurality of data blocks with a same similar fingerprint; a grouping unit 152 configured to perform step S302 in the data compression method shown in FIG. 3, and generate, based on a similarity degree between a plurality of data blocks included in each data block set, one or more compression groups, where one compression group includes a plurality of similar data blocks, the plurality of similar data blocks are a subset of data blocks included in the one or more data block sets, and a similarity degree between the plurality of similar data blocks meets a specific similarity condition; and a compression unit 153 configured to perform step S303 in the data compression method shown in FIG. 3, and compress the plurality of similar data blocks included in the compression group.

In a possible implementation, each similar data block has N data features, and the N data features describe a data block from N dimensions; and the similarity condition includes that at least two similar data blocks share M data features of the N data features, M is less than or equal to N, and there is an association relationship between the plurality of similar data blocks in the compression group.

In a possible implementation, the similarity condition further includes that M is greater than a specific threshold.

In a possible implementation, the plurality of similar data blocks in the compression group form a logic chain, the association relationship is that two adjacent similar data blocks on the logic chain share P data features, and P is greater than or equal to M and less than or equal to N.

In a possible implementation, a quantity of the plurality of similar data blocks is X, each similar data block has N data features, and the N data features describe a data block from N dimensions; and the similarity condition is that X data blocks with a highest similarity degree are selected from the one or more data block sets based on the N data features, and X is an integer greater than or equal to 2.

In a possible implementation, the data compression apparatus further includes a calculating unit configured to calculate a similar fingerprint of a to-be-compressed data block; a recording unit configured to record the to-be-compressed data block into a first data block set corresponding to a data block that has the same similar fingerprint as the to-be-compressed data block, where the first data block set is one of the one or more data block sets; a determining unit configured to determine, from the first data block set, a target data block that shares most data features with the to-be-compressed data block, and determine a first compression group including the target data block; and an adding unit configured to add the to-be-compressed data block to the first compression group.

In a possible implementation, the compression unit 153 is further configured to combine the plurality of similar data blocks into a combined data block and compress the combined data block to obtain compressed data.

In a possible implementation, the compression unit 153 is further further configured to generate metadata of the compressed data, the metadata includes location information of the plurality of similar data blocks in the combined data block, and the metadata is for decompressing the compressed data.

In a possible implementation, the compression unit 153 is further configured to select a reference data block from the plurality of similar data blocks; and perform delta compression on another similar data block in the plurality of similar data blocks based on the reference data block to obtain compressed data.

In a possible implementation, the compression unit 153 is further configured to generate metadata of the compressed data, the metadata includes information about a reference data block during delta compression and location information, in the compressed data, of data obtained by performing delta compression on each similar data block, and the metadata is for decompressing the compressed data.

An embodiment of this application further provides a storage device including a processing unit and a storage unit, where the storage unit stores executable code, and the processing unit executes the executable code to implement the methods shown in FIG. 3, FIG. 14, and FIG. 15.

An embodiment of this application further provides a computer-readable storage medium storing a computer program, where when the computer program is executed in a computer or a processor, the computer or the processor is enabled to perform the methods shown in FIG. 3, FIG. 14, and FIG. 15.

An embodiment of this application further provides a computer program product, where when the computer program product runs in a computer or a processor, the computer or the processor is enabled to perform the methods shown in FIG. 3, FIG. 14, and FIG. 15.

It should be understood that descriptions such as "first" and "second" in this specification are merely used for distinguishing between similar concepts for simplicity of description, and do not constitute any limitation.

It may be clearly understood by a person skilled in the art that descriptions of embodiments provided in this application may be referred to each other. For convenience and brevity of description, for example, for functions and performed steps of the apparatuses and devices provided in embodiments of this application, refer to related descriptions in the method embodiments of this application. The method embodiments and the apparatus embodiments may also be referred to each other.

A person skilled in the art may understand that all or a part of the steps of the foregoing method embodiments may be implemented by using a program instructing relevant hardware. The foregoing program may be stored in one computer-readable storage medium. When the program is executed, all or a part of the steps of the foregoing method embodiments are performed.

All or some of the foregoing embodiments may be implemented by using software, hardware, firmware, or any combination thereof. When software is used for implementation, all or some of embodiments may be implemented in a form of a computer program product. The computer program product includes one or more computer instructions. When the computer program instructions are loaded and executed on a computer, all or some of the procedures or functions based on embodiments of the present disclosure are generated. The computer may be a general-purpose computer, a dedicated computer, a computer network, or another programmable apparatus. The computer instructions may be stored in a computer-readable storage medium, or transmitted from one computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner. The computer-readable storage medium may be any usable medium accessible by a computer, or a data storage system such as a server or a data center, integrating one or more usable media.

In the several embodiments provided in this application, it should be understood that the disclosed apparatus and method may be implemented in other manners without departing from the scope of this application. For example, the described embodiment is merely an example. For example, the module or unit division is merely logical function division and may be other division during actual implementation. For example, a plurality of units or components may be combined or integrated into another system, or some features may be ignored or not performed. The units described as separate parts may or may not be physically separate, and parts displayed as units may or may not be physical units, that is, may be located in one place, or may be distributed on a plurality of network units. Some or all of the modules may be selected based on actual requirements to achieve the objectives of the solutions of embodiments. A person of ordinary skill in the art may understand and implement the solutions of embodiments without creative efforts.

In addition, the described apparatus, method, and schematic diagrams of different embodiments may be combined with or integrated with another system, module, technology, or method without departing from the scope of this application. In addition, the displayed or discussed mutual couplings or direct couplings or communication connections may be implemented via some interfaces. The indirect couplings or communication connections of the apparatuses or units may be implemented in electronic, mechanical, or other forms. The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method comprising:
   providing one or more data block sets;
   generating one or more compression groups based on a similarity degree between a plurality of data blocks in each of the data block sets, wherein a compression group of the one or more compression groups comprises a plurality of similar data blocks in the one or more data block sets, wherein each of the similar data blocks has N data features that describe a data block from N dimensions, and wherein the similarity degree meets a similarity condition; and
   compressing the plurality of similar data blocks comprised in the compression group;
   wherein the similarity condition comprises that at least two of the similar data blocks share M data features of the N data features, wherein M is less than or equal to N, and wherein there is an association relationship between the plurality of similar data blocks in the compression group,
   wherein the plurality of similar data blocks form a logic chain, wherein the association relationship is that two adjacent similar data blocks on the logic chain share P data features, and wherein P is greater than or equal to M and less than or equal to N, and
   wherein compressing the plurality of similar data blocks comprised in the compression group comprises:
   selecting for a data block on a child node in a tree relationship a data block on a parent node of the child node as a reference data block; and
   performing delta compression on the child node data blocks based on the respective reference blocks to obtain compressed data.

2. The method of claim 1, wherein the similarity condition further comprises that M is greater than a threshold.

3. The method of claim 1, wherein a quantity of the plurality of similar data blocks is X, wherein the similarity condition comprises selecting X data blocks with a highest similarity degree from the one or more data block sets based on the N data features, and wherein X is an integer greater than or equal to 2.

4. The method of claim 1, further comprising:
   calculating a similar fingerprint of a to-be-compressed data block;
   recording the to-be-compressed data block into a first data block set corresponding to a second data block that has the same fingerprint as the to-be-compressed data block, wherein the first data block set is one of the one or more data block sets;
   determining, from the first data block set, a target data block that shares data features with the to-be-compressed data block;
   determining a first compression group comprising the target data block; and
   adding the to-be-compressed data block to the first compression group.

5. The method of claim 1, further comprising generating metadata of the compressed data, wherein the metadata comprises location information of the plurality of similar data blocks, and wherein the metadata is for decompressing the compressed data.

6. The method of claim 1, further comprising generating metadata of the compressed data, wherein the metadata comprises information about the reference data block during the delta compression and comprises location information of data from the delta compression on each similar data block, and wherein the metadata is for decompressing the compressed data.

7. An apparatus comprising:
   a memory configured to store instructions; and
   a processor coupled to the memory and configured to:
   provide one or more data block sets;
   generate one or more compression groups based on a similarity degree between a plurality of data blocks in each of the data block sets, wherein a compression group of the one or more compression groups comprises a plurality of similar data blocks in the one or more data block sets, wherein each of the similar data blocks has N data features that describe a data block from N dimensions, and wherein the similarity degree meets a similarity condition; and
   compress the plurality of similar data blocks comprised in the compression group,
   wherein the similarity condition comprises that at least two of the similar data blocks share M data features of the N data features, wherein M is less than or equal to N, and wherein there is an association relationship between the plurality of similar data blocks in the compression group, wherein the plurality of similar data blocks form a logic chain, wherein the association relationship is that two adjacent similar data blocks on the logic chain share P data features, and wherein P is greater than or equal to M and less than or equal to N, and wherein compressing the plurality of similar data blocks comprised in the compression group comprises:

selecting for a data block on a child node in a tree relationship a data block on a parent node of the child node as a reference data block; and performing delta compression on the child node data blocks based on the respective reference blocks to obtain compressed data.

8. The apparatus of claim 7, wherein the similarity condition further comprises that M is greater than a threshold.

9. The apparatus of claim 7, wherein a quantity of the plurality of similar data blocks is X, wherein the similarity condition comprises selecting X data blocks with a highest similarity degree from the one or more data block sets based on the N data features, and wherein X is an integer greater than or equal to 2.

10. The apparatus of claim 7, wherein the processor is further configured to:

calculate a similar fingerprint of a to-be-compressed data block;

record the to-be-compressed data block into a first data block set corresponding to a second data block that has the same similar fingerprint as the to-be-compressed data block, wherein the first data block set is one of the one or more data block sets;

determine, from the first data block set, a target data block that shares data features with the to-be-compressed data block;

determine a first compression group comprising the target data block; and add the to-be-compressed data block to the first compression group.

11. The apparatus of claim 7, wherein the processor is further configured to generate metadata of the compressed data, wherein the metadata comprises location information of the plurality of similar data blocks, and wherein the metadata is for decompressing the compressed data.

12. The apparatus of claim 7, wherein the processor is further configured to generate metadata of the compressed data, wherein the metadata comprises information about the reference data block during the delta compression and location information of data from the delta compression on each similar data block, and wherein the metadata is for decompressing the compressed data.

* * * * *